(12) United States Patent
Honjo et al.

(10) Patent No.: US 8,080,740 B2
(45) Date of Patent: Dec. 20, 2011

(54) PRINTED CIRCUIT BOARD AND METHOD OF MANUFACTURING THE SAME

(75) Inventors: Mitsuru Honjo, Ibaraki (JP); Toshiki Naitou, Ibaraki (JP); Katsutoshi Kamei, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 502 days.

(21) Appl. No.: 12/358,671

(22) Filed: Jan. 23, 2009

(65) Prior Publication Data

US 2009/0195999 A1    Aug. 6, 2009

(30) Foreign Application Priority Data

Feb. 5, 2008    (JP) .................................. 2008-024841

(51) Int. Cl.
  *H05K 1/11* (2006.01)
(52) U.S. Cl. ....................................... 174/261; 361/761
(58) Field of Classification Search .................. 174/254, 174/260, 261; 361/761; 360/245.9; 29/846
  See application file for complete search history.

(56) References Cited

U.S. PATENT DOCUMENTS

| | | | |
|---|---|---|---|
| 6,728,071 B2 * | 4/2004 | Shimizu | 360/244.1 |
| 6,894,874 B2 * | 5/2005 | Maruyama et al. | 360/245.9 |
| 7,142,395 B2 * | 11/2006 | Swanson et al. | 360/245.9 |
| 2004/0070884 A1 * | 4/2004 | Someya et al. | 360/245.9 |
| 2004/0124493 A1 | 7/2004 | Chua | |
| 2007/0000689 A1 | 1/2007 | Ishimaru et al. | |
| 2007/0013056 A1 | 1/2007 | Lee et al. | |
| 2009/0151994 A1 * | 6/2009 | Ohsawa et al. | 174/261 |

FOREIGN PATENT DOCUMENTS

| | | |
|---|---|---|
| CN | 1504066 A | 6/2004 |
| JP | 05-152353 A | 6/1993 |
| JP | 2004-133988 A | 4/2004 |
| JP | 2006-120867 A | 5/2006 |
| JP | 2007-013018 A | 1/2007 |
| JP | 2007-027682 A | 2/2007 |
| WO | 02/087294 A1 | 10/2002 |

OTHER PUBLICATIONS

CN Office Action issued Jul. 26, 2011 from the Patent Office of the People's Republic of China in counterpart CN Application No. 200910000493.8. (English translation attached).

* cited by examiner

*Primary Examiner* — Yuriy Semenenko (74) *Attorney, Agent, or Firm* — Panitch Schwarze Belisario & Nadel LLP (57) ABSTRACT

A first insulating layer is formed on a suspension body, and a write wiring trace is formed on the first insulating layer. A second insulating layer is formed on the first insulating layer so as to cover the wiring trace. A ground layer is formed on the second insulating layer so as to be positioned above the wiring trace. Moreover, a third insulating layer is formed on the second insulating layer so as to cover the ground layer. A read wiring trace is formed on the third insulating layer. A fourth insulating layer is formed on the third insulating layer so as to cover the wiring trace.

4 Claims, 5 Drawing Sheets

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

An actuator is used in a drive such as a hard disk drive. Such an actuator includes an arm arranged rotatably with respect to a rotation shaft and a suspension board used for a magnetic head that is attached to the arm. The suspension board is a printed circuit board for aligning the magnetic head with a desired track of a magnetic disk.

Figure 5:
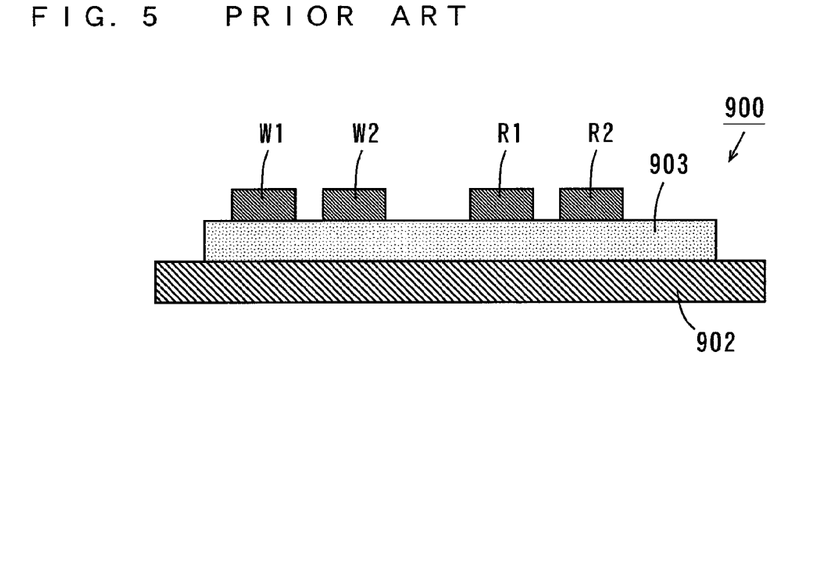
FIG. 5 is a vertical sectional view showing one example of a conventional suspension board.

FIG. 5 is a vertical sectional view showing one example of a conventional suspension board. In the suspension board 900 of FIG. 5, an insulating layer 903 is formed on a metal substrate 902. A pair of write conductors W1, W2 and a pair of read conductors R1, R2 are formed so as to align in sequence on the insulating layer 903.

One ends of the conductors W1, W2, R1, R2 are connected to a magnetic head (not shown). The other ends of the conductors W1, W2, R1, R2 are electrically connected to a write electrical circuit (not shown) and a read electrical circuit (not shown), respectively.

When a write current flows through the write conductors W1, W2, induced electromotive forces are generated in the read conductors R1, R2 by electromagnetic induction in the suspension board 900.

Here, the distance between the write conductors W1, W2 and the read conductor R1 is smaller than the distance between the write conductors W1, W2 and the read conductor R2. This causes a difference in the induced electromotive forces generated in the read conductors R1, R2. As a result, a current flows through the read conductors R1, R2. That is, a crosstalk occurs between the write conductors W1, W2 and the read conductors R1, R2.

Figure 6:
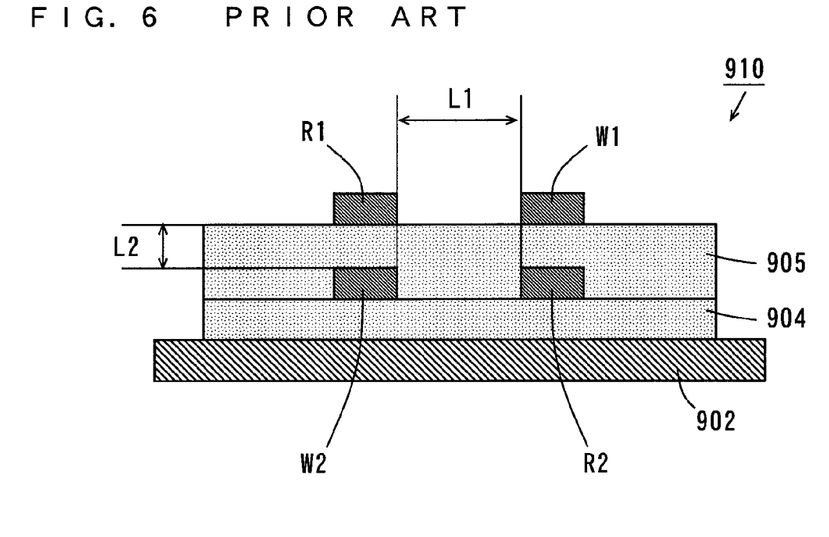
FIG. 6 is a vertical sectional view showing another example of the conventional suspension board.

Therefore, JP 2004-133988 A proposes a printed circuit board shown in FIG. 6 for preventing occurrence of the crosstalk between the write conductors W1, W2 and the read conductors R1, R2.

FIG. 6 is a vertical sectional view showing another example of the conventional suspension board. In the suspension board 910, a first insulating layer 904 is formed on the metal substrate 902. The write conductor W2 and the read conductor R2 are formed so as to be spaced apart from each other by a distance L1 on the first insulating layer 904.

A second insulating layer 905 is formed on the first insulating layer 904 so as to cover the write conductor W2 and the read conductor R2. On the second insulating layer 905, the write conductor W1 is formed at a position above the read conductor R2, and the read conductor R1 is formed at a position above the write conductor W2.

The distance between the read conductor R1 and the write conductor W2 that are positioned one above the other and the distance between the read conductor R2 and the write conductor W1 that are positioned one above the other are L2, respectively.

In the suspension board 910 of FIG. 6 having the foregoing configuration, the distances between the write conductors W1, W2 and the read conductor R1 are substantially equal to the distances between the write conductors W1, W2 and the read conductor R2, respectively. Accordingly, it is considered that the magnitude of the induced electromotive forces generated in the read conductors R1, R2 are substantially equal when the write current flows through the write conductors W1, W2.

In the suspension board 910, however, a material between the read conductor R1 and the write conductor W1 is different from a material between the read conductor R2 and the write conductor W2. Specifically, the material between the read conductor R1 and the write conductor W1 is air, while the material between the read conductor R2 and the write conductor W2 is an insulating material.

In this case, different dielectric constants of the air and the insulating material cause a parasitic capacitance between the read conductor R1 and the write conductor W1 to be different from a parasitic capacitance between the read conductor R2 and the write conductor W2. Thus, the write conductors W1, W2 have different characteristic impedances, and the read conductors R1, R2 have different characteristic impedances.

As a result, when the write current flows through the write conductors W1, W2, a potential difference between the read conductors R1, R2 occurs to cause the current to flow between the read conductors R1, R2. Accordingly, it is difficult to prevent occurrence of the crosstalk between the write conductors W1, W2 and the read conductors R1, R2 also in the suspension board 910 of FIG. 6.

In the suspension board 910 of FIG. 6, it is considered that occurrence of the crosstalk between the write conductors W1, W2 and the read conductors R1, R2 can be prevented by forming a new insulating layer having the same dielectric constant as that of the second insulating layer 905 so as to cover the write conductor W1 and the read conductor R1 on the second insulating layer 905, for example.

In practice, however, occurrence of the crosstalk between the write conductors W1, W2 and the read conductors R1, R2 cannot be sufficiently prevented even in such a configuration.

SUMMARY OF THE INVENTION

An object of the present invention is to provide a printed circuit board in which occurrence of a crosstalk between a plurality of signal line pairs can be sufficiently prevented and a method of manufacturing the same.

(1) According to an aspect of the present invention, a printed circuit board includes a first insulating layer, first and second wiring traces formed at a distance from each other on the first insulating layer, a second insulating layer formed on the first insulating layer so as to cover the first and second wiring traces, a metal layer formed on the second insulating layer so as to be positioned above the first and second wiring traces, a third insulating layer formed on the second insulating layer so as to cover the metal layer, third and fourth wiring traces formed on the third insulating layer, and a fourth insulating layer formed on the third insulating layer so as to cover the third and fourth wiring traces, wherein the first and second wiring traces constitute a first signal line pair, and the third and fourth wiring traces constitute a second signal line pair.

In the printed circuit board, the first and second wiring traces are formed at the distance from each other on the first insulating layer, the second insulating layer is formed on the first insulating layer so as to cover the first and second wiring traces, and the metal layer is formed on the second insulting layer so as to be positioned above the first and second wiring traces. The third insulating layer is formed on the second insulating layer so as to cover the metal layer, the third and fourth wiring traces are formed on the third insulating layer, and the fourth insulating layer is formed on the third insulating layer so as to cover the third and fourth wiring traces.

Here, the first and second wiring traces constitute the first signal line pair, and the third and fourth wiring traces constitute the second signal line pair in the printed circuit board. Furthermore, the metal layer is provided so as to be positioned above the first and second wiring traces. That is, the metal layer is provided between the first signal line pair and the second signal line pair.

This sufficiently prevents occurrence of a crosstalk between the first signal line pair and the second signal line pair at the time of use of the printed circuit board.

(2) The first wiring trace and the third wiring trace may be arranged so as to be opposite to each other with the metal layer sandwiched therebetween, and the second wiring trace and the fourth wiring trace may be arranged so as to be opposite to each other with the metal layer sandwiched therebetween.

In this case, occurrence of the crosstalk between the first signal line pair and the second signal line pair is more sufficiently prevented.

(3) The printed circuit board may further include a metal substrate having a long-sized shape, and a head that is provided on said metal substrate for reading/writing a signal, wherein the first insulating layer may be formed on the metal substrate, and the first, second, third and fourth wiring traces may be electrically connected to the head.

In this case, the printed circuit board can be used as a suspension board of a drive such as a hard disk drive.

Then, information can be written and read in/from a magnetic disk by the first and second wiring traces constituting the first signal line pair and the third and fourth wiring traces constituting the second signal line pair.

This sufficiently prevents occurrence of the crosstalk between the first signal line pair and the second signal line pair, thus reliably preventing generation of errors at the time of writing and reading.

(4) According to another aspect of the present invention, a method of manufacturing a printed circuit board includes the steps of forming first and second wiring traces at a distance from each other on a first insulating layer, forming a second insulating layer on the first insulating layer so as to cover the first and second wiring traces, forming a metal layer on the second insulating layer so as to be positioned above the first and second wiring traces, forming a third insulating layer on the second insulating layer so as to cover the metal layer, forming third and fourth wiring traces on the third insulating layer, and forming a fourth insulating layer on the third insulating layer so as to cover the third and fourth wiring traces, wherein the first and second wiring traces constitute a first signal line pair, and the third and fourth wiring traces constitute a second signal line pair.

According to the method of manufacturing the printed circuit board, the first and second wiring traces are formed at the distance from each other on the first insulating layer, the second insulating layer is formed on the first insulating layer so as to cover the first and second wiring traces, and the metal layer is formed on the second insulting layer so as to be positioned above the first and second wiring traces. The third insulating layer is formed on the second insulating layer so as to cover the metal layer, the third and fourth wiring traces are formed on the third insulating layer, and the fourth insulating layer is formed on the third insulating layer so as to cover the third and fourth wiring traces.

In the printed circuit board manufactured in such a manner, the first and second wiring traces constitute the first signal line pair, and the third and fourth wiring traces constitute the second signal line pair. Furthermore, the metal layer is provided so as to be positioned above the first and second wiring traces. That is, the metal layer is provided between the first signal line pair and the second signal line pair.

This sufficiently prevents occurrence of the crosstalk between the first signal line pair and the second signal line pair at the time of use of the printed circuit board.

According to the present invention, occurrence of the crosstalk between the first signal line pair and the second signal line pair is sufficiently prevented at the time of use of the printed circuit board.

Other features, elements, characteristics, and advantages of the present invention will become more apparent from the following description of preferred embodiments of the present invention with reference to the attached drawings.

DESCRIPTION OF THE PREFERRED EMBODIMENTS

Hereinafter, a printed circuit board and a method of manufacturing the same according to embodiments of the present invention will be described while referring to the drawings. The configuration of a suspension board used in an actuator of a hard disk drive and a method of manufacturing the same will be described as an example of the printed circuit board according to the embodiments of the present invention.

(1-1) Configuration of the Suspension Board

Figure 1:
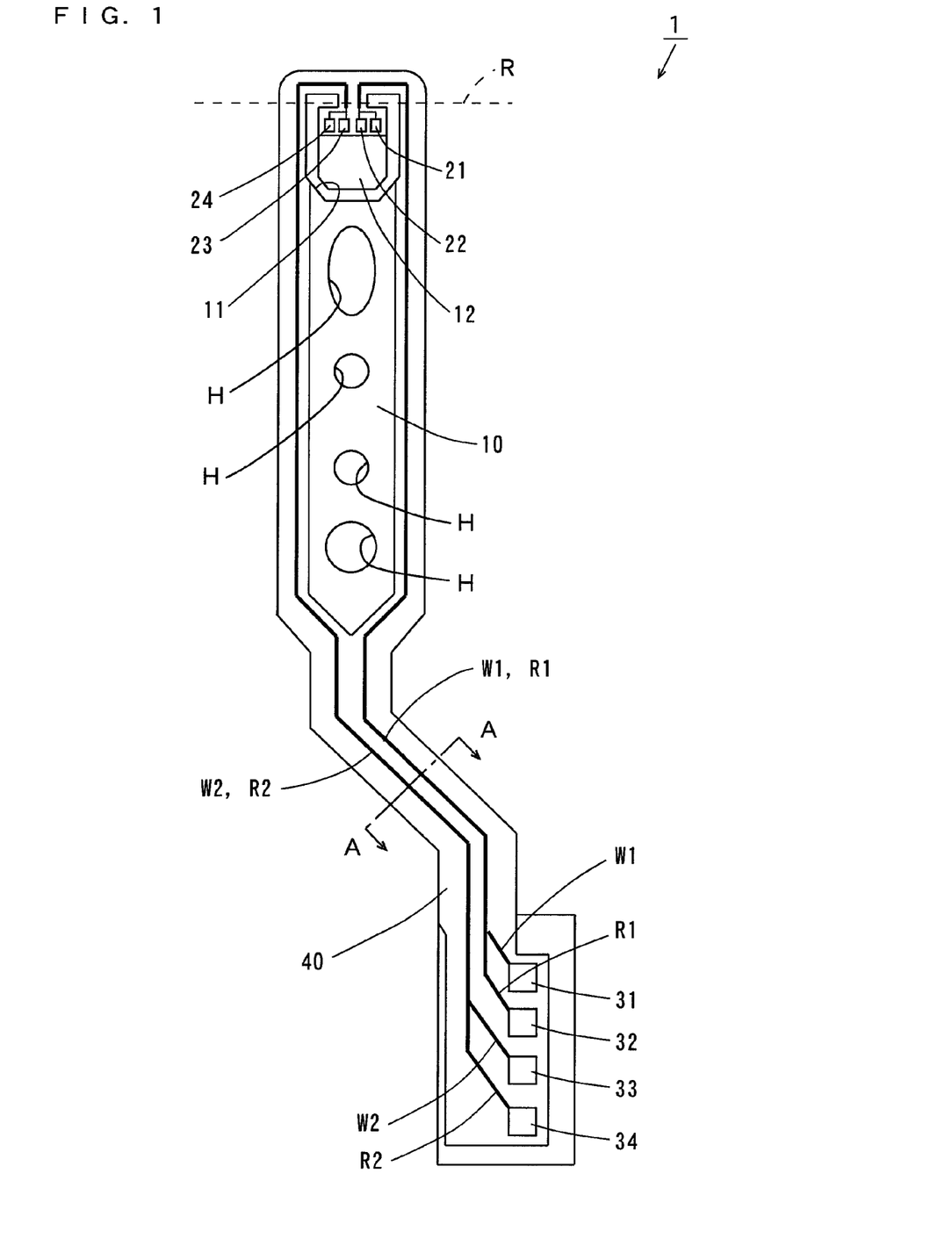
FIG. 1 is a plan view of a suspension board according to one embodiment of the present invention.
Figure 2:
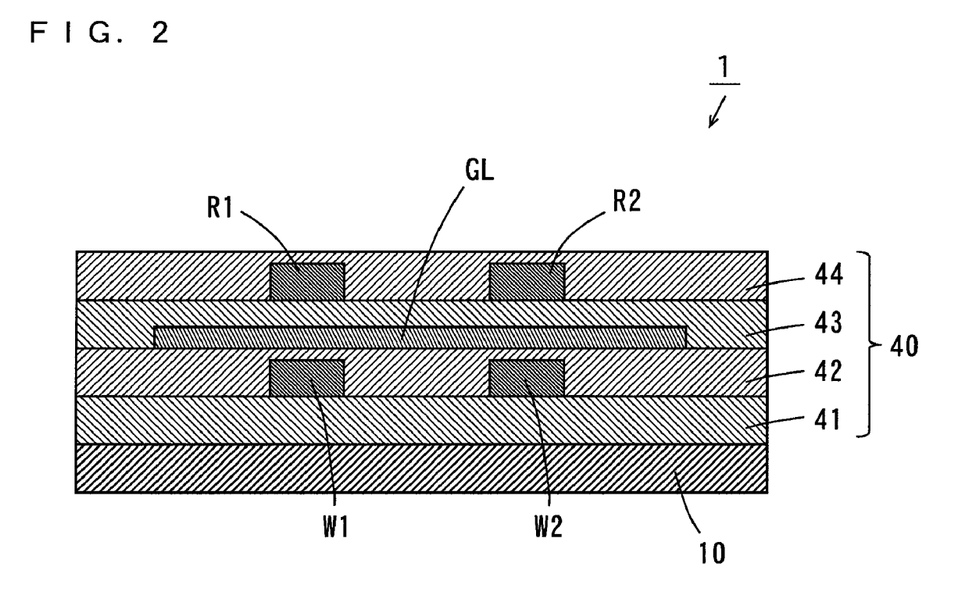
FIG. 2 is a vertical sectional view of the suspension board taken along the line A-A of FIG. 1.

FIG. 1 is a top view of the suspension board according to one embodiment of the present invention, and FIG. 2 is a vertical sectional view of the suspension board 1 taken along the line A-A of FIG. 1.

As shown in FIG. 1, the suspension board 1 includes a suspension body 10 formed of a long-sized metal substrate. A write wiring trace W1, a read wiring trace R1, a write wiring trace W2 and a read wiring trace R2 are formed on the suspension body 10 as indicated by the thick solid lines.

At an end of the suspension body 10, a U-shaped opening 11 is formed, thereby providing a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another by the wiring traces W1, R1, W2, R2, respectively. A plurality of holes H are formed in the suspension body 10.

In the suspension board 1, an insulating layer 40 composed of a plurality of layers is formed in a region where the plurality of wiring traces W1, W2, R1, R2 are formed so as to cover each of the wiring traces W1, W2, R1, R2.

As shown in FIG. 2, the insulating layer 40 is composed of first, second, third and fourth insulating layers 41, 42, 43, 44. The first insulating layer 41 is formed on the suspension body 10.

The write wiring traces W1, W2 for writing information in a magnetic disk that is not shown are formed on the first insulating layer 41. The write wiring traces W1, W2 are aligned in parallel with each other at a predetermined distance.

Moreover, the second insulating layer 42 is formed on the first insulating layer 41 so as to cover the write wiring traces W1, W2.

A ground layer GL is formed on the second insulating layer 42 so as to be positioned above the write wiring traces W1, W2. In addition, the third insulating layer 43 is formed on the second insulating layer 42 so as to cover the ground layer GL.

On the third insulating layer 43, the read wiring trace R1 is formed at a position above the write wiring trace W1, and the read wiring trace R2 is formed at a position above the write wiring trace W2.

Furthermore, the fourth insulating layer 44 is formed on the third insulating layer 43 so as to cover the read wiring traces R1, R2.

In the hard disk, which is not shown, including the suspension board 1, a current flows through the pair of write wiring traces W1, W2 at the time of writing information in the magnetic disk. Moreover, the current flows through the pair of read wiring traces R1, R2 at the time of reading information from the magnetic disk.

(1-2) Manufacture of the Suspension Board

The method of manufacturing the suspension board 1 will be described. Description of respective steps of forming the tongue 12, the electrode pads 21 to 24, 31 to 34 and the holes H of FIG. 1 is omitted in the following description.

Figure 3:
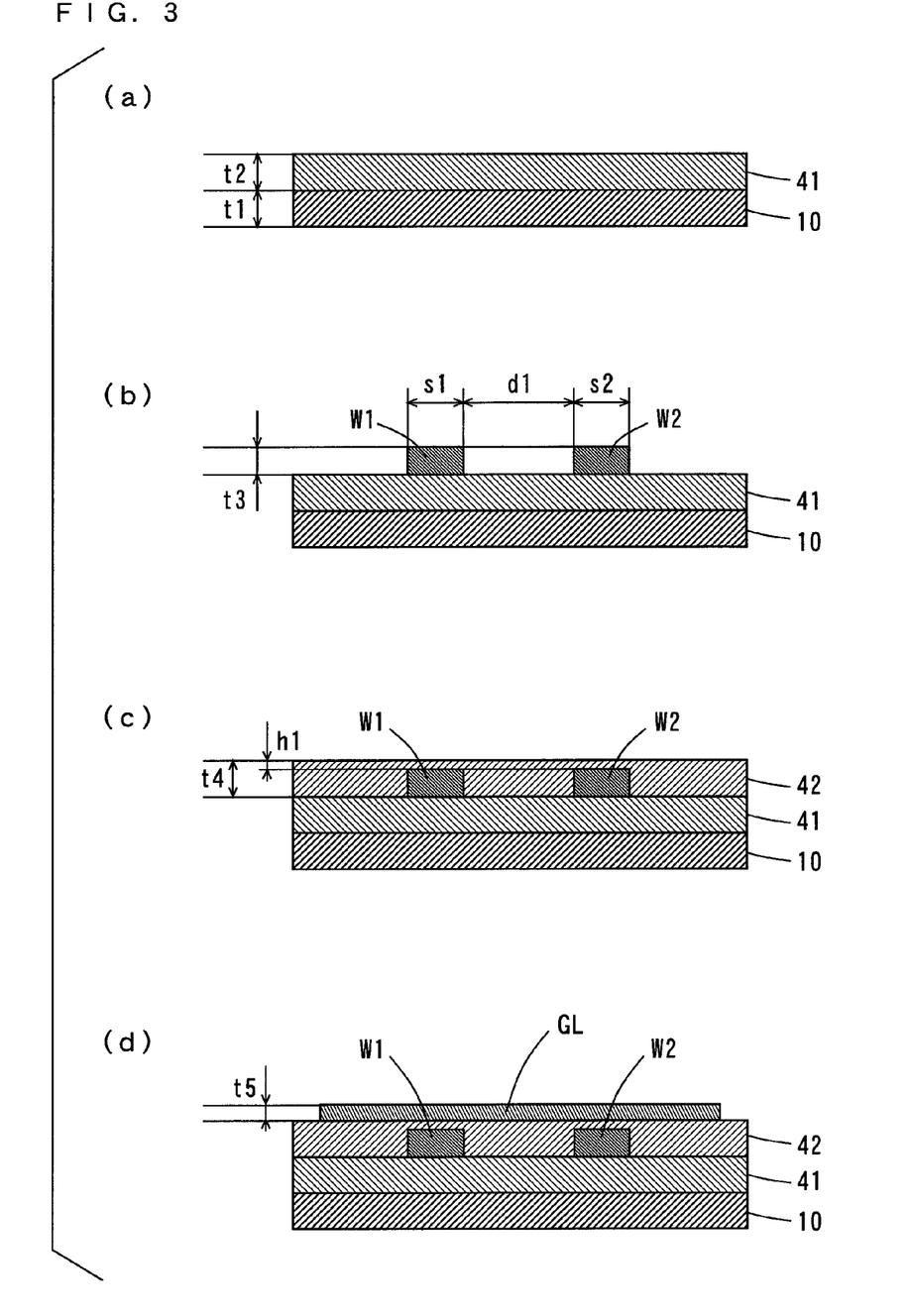
FIG. 3 is a diagram showing steps of manufacturing the suspension board according to the one embodiment of the present invention.
Figure 4:
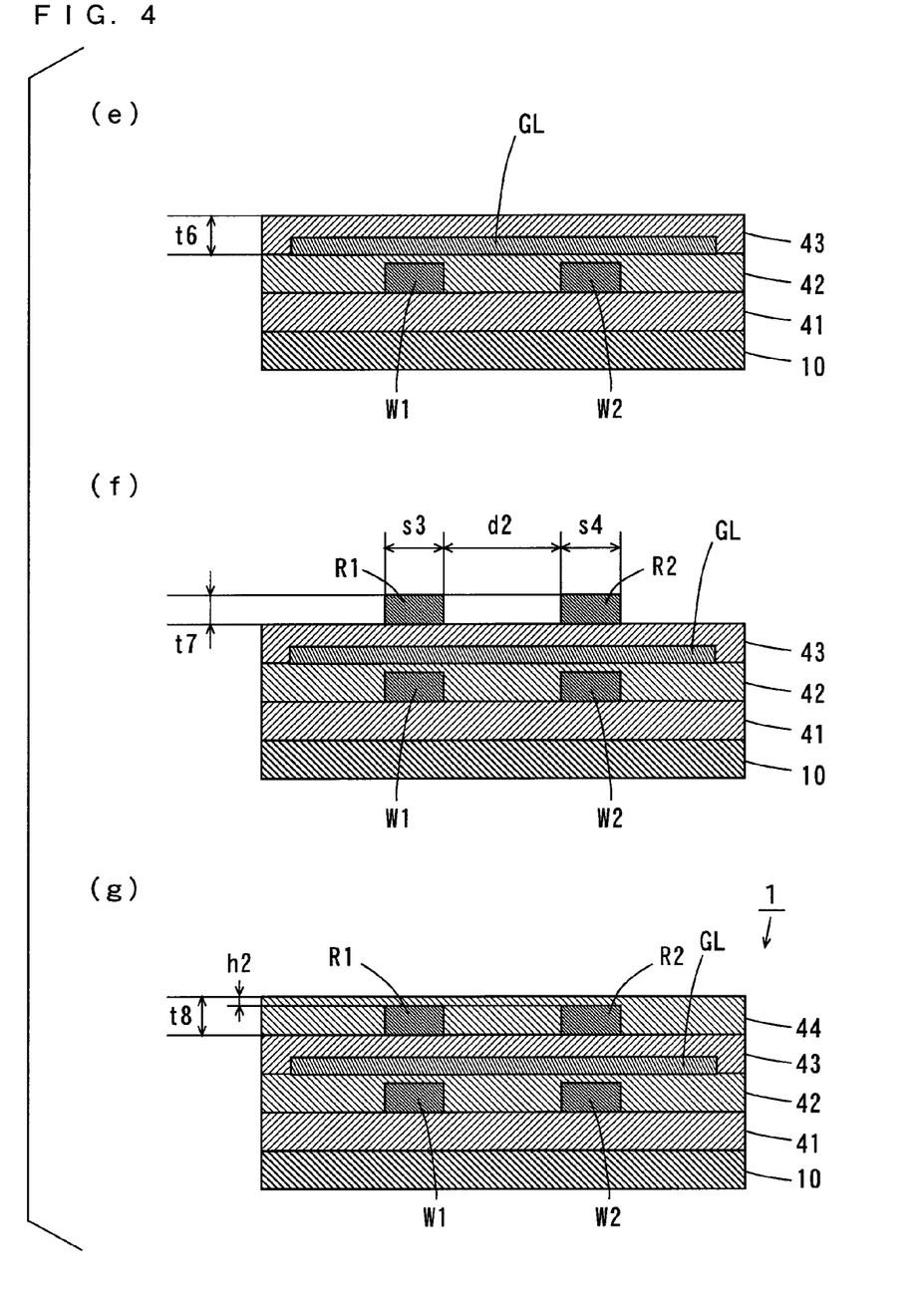
FIG. 4 is a diagram showing steps of manufacturing the suspension board according to the one embodiment of the present invention.

FIGS. 3 and 4 are vertical sectional views showing steps of manufacturing the suspension board 1 according to the one embodiment of the present invention. First, the long-sized substrate made of stainless steel (SUS) is prepared as the suspension body 10 as shown in FIG. 3(a). Then, the first insulating layer 41 mainly made of polyimide resin is formed on the suspension body 10.

A long-sized substrate made of another material such as aluminum (Al) instead of stainless steel may be used as the suspension body 10. The thickness t1 of the suspension body 10 is not less than 5 µm and not more than 50 µm, for example, and preferably not less than 10 µm and not more than 30 µm. The thickness t2 of the first insulating layer 41 is not less than 3 µm and not more than 20 µm, for example, and preferably not less than 5 µm and not more than 15 µm.

Then, the write wiring traces W1, W2 made of copper (Cu) are formed on the first insulating layer 41 as shown in FIG. 3(b). The write wiring traces W1, W2 are formed in parallel with each other at the predetermined distance.

The write wiring traces W1, W2 may be formed using a semi-additive method, for example, and may be formed using another method such as a subtractive method.

The write wiring traces W1, W2 can be formed using another metal such as gold (Au) and aluminum or an alloy such as a copper alloy and an aluminum alloy, not limited to copper.

The thickness t3 of the write wiring traces W1, W2 is not less than 3 µm and not more than 16 µm, for example, and preferably not less than 6 µm and not more than 13 µm. Each of the widths s1, s2 of the write wiring traces W1, W2 is not less than 5 µm and not more than 30 µm, for example, and preferably not less than 10 µm and not more than 25 µm.

The distance d1 between the write wiring trace W1 and the write wiring trace W2 is not less than 5 µm and not more than 100 µm, for example, and preferably not less than 10 µm and not more than 60 µm.

In the above-described configuration, thin metal films may be formed between the first insulating layer 41 and the write wiring traces W1, W2, respectively. In this case, adhesion between the first insulating layer 41 and the write wiring traces W1, W2 is improved.

After that, the second insulating layer 42 mainly made of polyimide resin is formed on the first insulating layer 41 so as to cover the write wiring traces W1, W2 as shown in FIG. 3(c).

The thickness t4 of the second insulating layer 42 is not less than 4 µm and not more than 20 µm, for example, and preferably not less than 7 µm and not more than 17 µm. The thickness h1 between upper surfaces of the write wiring traces W1, W2 and an upper surface of the second insulating layer 42 is not less than 1 µm and not more than 5 µm, for example.

Next, the ground layer GL made of copper (Cu) is formed on the second insulating layer 42 so as to be positioned above the write wiring traces W1, W2 as shown in FIG. 3(d). The ground layer GL may be formed using electrolytic plating, for example, and may be formed using another method such as sputtering.

The thickness t5 of the ground layer GL is not less than 1 µm and not more than 10 µm, for example, and preferably not less than 3 µm and not more than 8 µm. Note that the ground layer GL can be formed using another metal such as gold (Au) and aluminum or an alloy such as a copper alloy and an aluminum alloy, not limited to copper.

The third insulating layer 43 mainly made of polyimide resin is subsequently formed on the second insulating layer 42 so as to cover the ground layer GL as shown in FIG. 4(e). The thickness t6 of the third insulating layer 43 is not less than 4 µm and not more than 20 µm, for example, and preferably not less than 6 µm and not more than 15 µm.

As shown in FIG. 4(f), the read wiring traces R1, R2 made of copper are formed on the third insulating layer 43. Here, the read wiring traces R1, R2 are formed at respective positions above the write wiring traces W1, W2. This causes the upper surface of the write wiring trace W1 and a lower surface of the read wiring trace R1 to be opposite to each other, and causes the upper surface of the write wiring trace W2 and a lower surface of the read wiring trace R2 to be opposite to each other.

The read wiring traces R1, R2 are formed in the same manner as the write wiring traces W1, W2. The write wiring trace W2 and the read wiring trace R2 can be formed using another metal such as gold (Au) and aluminum or an alloy such as a copper alloy and an aluminum alloy, not limited to copper.

The thickness t7 of the read wiring traces R1, R2 is not less than 3 µm and not more than 16 µm, for example, and preferably not less than 6 µm and not more than 13 µm. Each of the widths s3, s4 of the read wiring traces R1, R2 is not less than 5 µm and not more than 30 µm, for example, and preferably not less than 10 µm and not more than 25 µm.

The distance d2 between the read wiring trace R1 and the read wiring trace R2 is not less than 5 µm and not more than 100 µm, for example, and preferably not less than 10 µm and not more than 60 µm.

Thin metal films may be formed between the third insulating layer 43 and the read wiring traces R1, R2, respectably. In this case, adhesion between the third insulating layer 43 and the read wiring traces R1, R2 is improved.

Finally, the fourth insulating layer 44 made of polyimide resin is formed on the third insulating layer 43 so as to cover the read wiring traces R1, R2 as shown in FIG. 4(g).

The thickness t8 of the fourth insulating layer 44 is not less than 4 μm and not more than 20 μm, for example, and preferably not less than 7 μm and not more than 17 μm. The thickness h2 between upper surfaces of the read wiring traces R1, R2 and an upper surface of the fourth insulating layer 44 is not less than 1 μm and not more than 5 μm, for example.

As described above, the plurality of wiring traces W1, W2, R1, R2 and the insulating layer 40 are formed on the suspension body 10, so that the suspension board 1 is completed.

In the suspension board 1, the widths s1, s2 of the write wiring traces W1, W2 are equal to each other, and the widths s3, s4 of the read wiring traces R1, R2 are equal to each other.

The widths s1, s3 of the write wiring trace W1 and the read wiring trace R1 may be equal to or different from each other. Also, the width s2, s4 of the write wiring trace W2 and the read wiring trace R2 may be equal to or different from each other.

(1-3) Effects

In the suspension board 1 according to the present embodiment, the write wiring traces W1, W2 are provided on the first insulating layer 41 so as to be covered with the second insulating layer 42. Moreover, the read wiring traces R1, R2 are provided on the third insulating layer 43 so as to be covered with the fourth insulating layer 44. Furthermore, the ground layer GL is provided so as to be covered with the second insulating layer 42 and the third insulating layer 43 between the write wiring traces W1, W2 and the read wiring traces R1, R2.

This sufficiently prevents occurrence of a crosstalk between the write wiring traces W1, W2 and the read wiring traces R1, R2 at the time of use of the suspension board 1.

Accordingly, generation of errors at the time of writing and reading of information in/from the magnetic disk is reliably prevented in the hard disk, which is not shown, including the suspension board 1.

(1-4) Other Embodiments

While the write wiring trace W1 and the read wiring trace R1 are opposite to each other and the write wiring trace W2 and the read wiring trace R2 are opposite to each other in the above-described embodiment, the write wiring trace W1 and the read wiring trace R1 may not be opposite to each other, and the write wiring trace W2 and the read wiring trace R2 may not be opposite to each other.

Note that the wiring traces W1, W2, R1, R2 are preferably provided such that the median line centered between the write wiring trace W1 and the write wiring trace W2 overlaps the median line centered between the read wiring trace R1 and the read wiring trace R2.

While the write wiring traces W1, W2 are provided on the first insulating layer 41 and the read wiring traces R1, R2 are provided on the third insulating layer 43 in the above-described embodiment, the read wiring traces R1, R2 may be provided on the first insulating layer 41 and the write wiring traces W1, W2 may be provided on the third insulating layer 43.

The suspension body 10 may not be provided.

Another resin material such as epoxy resin, acrylic resin, polyethernitrile resin, polyethersulfone resin, polyethylene terephthalate resin, polyethylene naphthalate resin and polyvinyl chloride resin may be used for the first to fourth insulating layers 41 to 44 instead of polyimide resin.

The first to fourth insulating layers 41 to 44 may be formed of different insulating materials.

(1-5) Correspondences between Elements in the Claims and Parts in Embodiments In the following paragraph, non-limiting examples of correspondences between various elements recited in the claims below and those described above with respect to various preferred embodiments of the present invention are explained.

In the above-described embodiments, the write wiring trace W1 is an example of a first wiring trace, the write wiring trace W2 is an example of a second wiring trace, the read wiring trace R1 is an example of a third wiring trace, the read wiring trace R2 is an example of a fourth wiring trace, the ground layer GL is an example of a metal layer, the suspension body 10 is an example of a metal substrate, and the tongue 12 is an example of a head.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising:
   a first insulating layer;
   first and second wiring traces formed at a distance from each other on said first insulating layer;
   a second insulating layer formed on said first insulating layer so as to cover said first and second wiring traces;
   a metal layer formed on said second insulating layer so as to be positioned above said first and second wiring traces;
   a third insulating layer formed on said second insulating layer so as to cover said metal layer;
   third and fourth wiring traces formed on said third insulating layer; and
   a fourth insulating layer formed on said third insulating layer so as to cover said third and fourth wiring traces, wherein
   said first and second wiring traces constitute a first signal line pair, and said third and fourth wiring traces constitute a second signal line pair.

2. The printed circuit board according to claim 1, wherein said first wiring trace and said third wiring trace are arranged so as to be opposite to each other with said metal layer sandwiched therebetween, and said second wiring trace and said fourth wiring trace are arranged so as to be opposite to each other with said metal layer sandwiched therebetween.

3. The printed circuit board according to claim 1, further comprising
   a metal substrate having a long-sized shape, and
   a head that is provided on said metal substrate for reading/writing a signal, wherein
   said first insulating layer is formed on said metal substrate, and
   said first, second, third and fourth wiring traces are electrically connected to said head.

4. A method of manufacturing a printed circuit board, comprising the steps of:
   forming first and second wiring traces at a distance from each other on a first insulating layer;
   forming a second insulating layer on said first insulating layer so as to cover said first and second wiring traces;
   forming a metal layer on said second insulating layer so as to be positioned above said first and second wiring traces;
   forming a third insulating layer on said second insulating layer so as to cover said metal layer;
   forming third and fourth wiring traces on said third insulating layer; and
   forming a fourth insulating layer on said third insulating layer so as to cover said third and fourth wiring traces, wherein
   said first and second wiring traces constitute a first signal line pair, and said third and fourth wiring traces constitute a second signal line pair.

* * * * *